(12) United States Patent
Naito et al.

(10) Patent No.: US 7,495,182 B2
(45) Date of Patent: Feb. 24, 2009

(54) ELECTROMAGNETIC WAVE SHIELDING SHEET AND PROCESS FOR PRODUCING THE SAME

(75) Inventors: Nobuo Naito, Tokyo (JP); Fumihiro Arakawa, Tokyo (JP); Tadahiro Masaki, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 426 days.

(21) Appl. No.: 10/582,162

(22) PCT Filed: Jan. 26, 2005

(86) PCT No.: PCT/JP2005/001015

§ 371 (c)(1),
(2), (4) Date: Jun. 8, 2006

(87) PCT Pub. No.: WO2005/074347

PCT Pub. Date: Aug. 11, 2005

(65) Prior Publication Data

US 2008/0277157 A1    Nov. 13, 2008

(30) Foreign Application Priority Data

Jan. 30, 2004   (JP) .............................. 2004-022370

(51) Int. Cl.
*H05K 9/00*   (2006.01)
(52) U.S. Cl. .................. 174/389; 174/392; 313/379
(58) Field of Classification Search .................. 174/389, 174/392; 361/816, 818; 313/479
See application file for complete search history.

(56) References Cited

U.S. PATENT DOCUMENTS

| | | | |
|---|---|---|---|
| 6,417,619 B1 * | 7/2002 | Yasunori et al. | 313/582 |
| 6,429,587 B1 * | 8/2002 | Sugimachi et al. | 313/582 |
| 6,448,492 B1 * | 9/2002 | Okada et al. | 174/389 |
| 6,495,752 B1 * | 12/2002 | Sugizaki et al. | 174/389 |
| 6,621,003 B2 * | 9/2003 | Yoshida et al. | 174/389 |
| 6,686,536 B2 * | 2/2004 | Tone et al. | 174/389 |
| 7,037,594 B2 * | 5/2006 | Kojima et al. | 428/601 |
| 7,255,980 B2 * | 8/2007 | Hwang et al. | 430/321 |
| 7,375,292 B2 * | 5/2008 | Naito et al. | 174/389 |
| 2003/0013048 A1 * | 1/2003 | Gilson | 430/321 |
| 2003/0164243 A1 | 9/2003 | Arakawa et al. | |
| 2004/0000416 A1 * | 1/2004 | Hou | 174/35 MS |

FOREIGN PATENT DOCUMENTS

| | | | |
|---|---|---|---|
| JP | A 2000-013088 | 1/2000 | |
| JP | A 2000-059079 | 2/2000 | |
| JP | A 2002-009484 | 1/2002 | |
| JP | A 2002-190692 | 7/2002 | |
| JP | A 2002-353684 | 12/2002 | |
| JP | A 2003-318596 | 11/2003 | |

\* cited by examiner

*Primary Examiner*—Hung V Ngo
(74) *Attorney, Agent, or Firm*—Oliff & Berridge, PLC

(57) ABSTRACT

An electromagnetic wave shielding sheet 1 comprises a transparent substrate 11, and line parts 107 that define openings 105, provided on the transparent substrate 11. The line parts 107 have a metal mesh layer 21, and a blackening layer 25A formed on the surface of the metal layer 21, on the side of the transparent substrate 11. Matted layers 31 are formed on the side faces of the line parts 107, and an anticorrosive layer 23A is provided between the blackening layer 25A and the transparent substrate 11.

7 Claims, 4 Drawing Sheets

US 7,495,182 B2

ELECTROMAGNETIC WAVE SHIELDING SHEET AND PROCESS FOR PRODUCING THE SAME

FIELD OF THE INVENTION

The present invention relates to an electromagnetic wave shielding sheet for preventing EMI (electromagnetic interference) that is caused by such displays as cathode ray tubes (hereinafter also referred to as CRTs) and plasma display panels (hereinafter also referred to as PDPs), and, more particularly, to an electromagnetic wave shielding sheet that makes a displayed image highly visible and that can be produced in a small number of steps, and to a process for producing the electromagnetic wave shielding sheet.

In this Specification, "ratio", "part", "%", and the like that indicate proportions are on a weight basis unless otherwise specified, and the symbol "/" denotes that layers enumerated together with this symbol are integrally laminated. Further, "NIR" and "PET" designate "near infrared rays" and "polyethylene terephthalate", respectively, and are abbreviations, synonyms, functional expressions, common designations, or terms used in the art.

BACKGROUND ART

1. Background Art

Electromagnetic interference has increased in recent years due to advances in the performance of electrical and electronic equipment and the growing use of the same. Even such displays as CRTs and PDPs emit electromagnetic waves. A PDP is an assembly composed of a glass substrate having a data electrode and a fluorescent layer, and a glass substrate having a transparent electrode. When operated, such a display not only emits visible light that produces an image, but also generates electromagnetic waves, near infrared rays, and heat in large amounts. In general, a front panel containing an electromagnetic wave shielding sheet is mounted on the front of a PDP in order to shield electromagnetic waves. The required efficiency in shielding electromagnetic waves with frequencies of 30 MHz to 1 GHz, emitted from the front of the display, is 30 dB or more.

Further, to make an image displayed on the display highly visible, the electromagnetic wave shielding material is required to be not highly visible (or highly invisible), and the front panel is required to have moderate transparency (visible light transmission), as a whole.

Furthermore, PDPs are characterized by having large-sized screens, and electromagnetic wave shielding sheets for such PDPs are large in size (external dimension); their sizes are as large as 621×831 mm for 37-inch displays and 983×583 mm for 42-inch displays, for example, and still larger sizes exist. This fact requires a production process that is convenient to handle large-sized materials. There is, therefore, a demand for a process for producing an electromagnetic wave shielding sheet by which an electromagnetic wave shielding sheet can be obtained in a small number of steps with high productivity.

2. Prior Art

Electromagnetic wave shielding sheets containing metal mesh layers have so far been known as electromagnetic wave shielding sheets having visible light transmission and electromagnetic wave shielding ability that are compatible with each other. Usually used to produce such electromagnetic wave shielding sheets are the following two processes.

A known process for producing an electromagnetic wave shielding sheet of the above-described type is that electrically conductive ink or a photosensitive coating liquid containing a catalyst for chemical plating is applied to the entire surface of a transparent substrate, and the coating is photolithographically made into a mesh, which is then plated with a metal (see Patent Documents 1 and 2, for example). However, such a metal mesh layer is disadvantageous in that, since it is highly lustrous and reflects extraneous light such as sunlight, the mesh is noticeable, and, moreover, a screen appears white due to the metal mesh layer to decrease image contrast. In order to solve the above problem, a blackening layer is formed on the observer-side surface of the metal mesh layer. However, so far as this means is employed, it is impossible to blacken the transparent-substrate-side surface of the metal layer. Therefore, this means cannot cope with such a design that an electromagnetic wave shielding sheet is mounted on a display with the transparent substrate side of the sheet facing to the observer side. In addition, it takes a long time for plating if electrically conductive ink is used because such ink has high electrical resistance.

Another known process for producing an electromagnetic wave shielding sheet of the above-described type is as follows: a PET film (transparent substrate) and a copper mesh layer with line parts that define multiple openings are laminated with an adhesive layer; and all of the surfaces, back surfaces, and side faces of the line parts of the copper mesh layer are subjected to blackening treatment (see Patent Document 3, for example). An electromagnetic wave shielding sheet obtained by this process absorbs all extraneous light incident on the surfaces, back surfaces, and side faces of the line parts of the mesh, and all light entering the back surfaces and side faces of the line parts from a display, so that it is possible to prevent glistening and whitening of the line parts of the mesh that occurs when the line parts reflect the light. It is, therefore, possible to prevent, even in the light, the mesh from glistening and whitening to become noticeable and also a screen from appearing white to make image contrast lower. In this production process, however, it is necessary to form, on the entire metal mesh surface, a layer of another material such as copper oxide by such a method as plating, so that the blackening layer thus formed has been disadvantageous in that it easily falls off the metal. Further, since it is necessary to prepare a material for forming the blackening layer, material cost increases, and, moreover, only limited materials can be used for this purpose when adhesion to the metal, etc. are taken into consideration. Furthermore, it is necessary to add, to the production process, the step of conducting anticorrosion treatment for imparting corrosion resistance to the metal layer, and the addition of this step reduces productivity.

Patent Document 1: Japanese Laid-Open Patent Publication No. 13088/2000,

Patent Document 2: Japanese Laid-Open Patent Publication No. 59079/2000, and

Patent Document 3: Japanese Laid-Open Patent Publication No. 9484/2002.

SUMMARY OF THE INVENTION

The present invention was accomplished in order to solve the above-described problems in the prior art. An object of the present invention is, therefore, to provide an electromagnetic wave shielding sheet that comprises a metal mesh layer whose observer-side surface is blackened and whose mesh lines are made to have matted side faces in order that the electromagnetic wave shielding sheet has moderate transparency, high electromagnetic wave shielding ability, high invisibility of the mesh, and an excellent external appearance, and makes an image displayed on a display highly visible, and a production process by which the electromagnetic wave shielding sheet can be produced in a small number of steps.

The present invention is an electromagnetic wave shielding sheet comprising a transparent substrate, and line parts that define openings, formed on one surface of the transparent substrate, the line parts having a metal mesh layer and a blackening layer formed at least on one surface of the metal layer, matted layers being formed so that, of the side faces of the line parts, at least the side faces of the metal layer are covered with the matted layers.

The present invention is the electromagnetic wave shielding sheet in which an anticorrosive layer is formed on the surface of the metal layer or of the blackening layer.

The present invention is the electromagnetic wave shielding sheet in which the matted layers are formed to cover the side faces of the metal layer, the blackening layer, and the anticorrosive layer that constitute the line parts.

The present invention is the electromagnetic wave shielding sheet in which the blackening layer is made of a copper-cobalt alloy or a nickel alloy.

The present invention is the electromagnetic wave shielding sheet in which the anticorrosive layer contains chromium, zinc, or both chromium and zinc.

The present invention is the electromagnetic wave shielding sheet in which an adhesive layer is interposed between the transparent substrate and the line parts.

The present invention is a process for producing an electromagnetic wave shielding sheet comprising a transparent substrate, and line parts that define openings, formed on one surface of the transparent substrate, the line parts having a metal mesh layer and a blackening layer formed at least on one surface of the metal layer, matted layers being formed so that, of the side faces of the line parts, at least the side faces of the metal layer are covered with the matted layers, the process comprising the steps of preparing a metal layer, forming a blackening layer at least on one surface of the metal layer, laminating a transparent substrate to the metal layer and the blackening layer by an adhesive with the blackening layer facing to the transparent substrate, thereby obtaining a laminate, photolithographically patterning, the blackening layer and the metal layer in the laminate, into a mesh, to form line parts defining openings that have the metal layer and the blackening layer and forming, by matting treatment, matted layers at least on the side faces of the metal layer in the line parts.

The present invention provides an electromagnetic wave shielding sheet having moderate transparency and high electromagnetic wave shielding ability, comprising mesh line parts that do not reflect extraneous light to make the mesh highly invisible, to make image contrast high in the presence of extraneous light, and to make a displayed image highly visible. Further, if a specific material is selected to form the blackening layer, the formation of the blackening layer only on one surface of the metal layer is sufficient to fulfill the purpose. Falling off the blackening layer and an increase in material cost are thus minimized.

The present invention provides a highly durable electromagnetic wave shielding sheet whose metal layer is hard to rust.

The present invention provides an electromagnetic wave shielding sheet that is excellent in the invisibility of the mesh and that can make image contrast high in the presence of extraneous light and make a displayed image highly visible.

The present invention provides a process for producing an electromagnetic wave shielding sheet by which an electromagnetic wave shielding sheet can be easily produced in a minimum number of steps, using the existing technique and equipment.

BEST MODE FOR CARRYING OUT THE INVENTION

Embodiments of the present invention will be described hereinafter with reference to the accompanying drawings.

Figure 1:
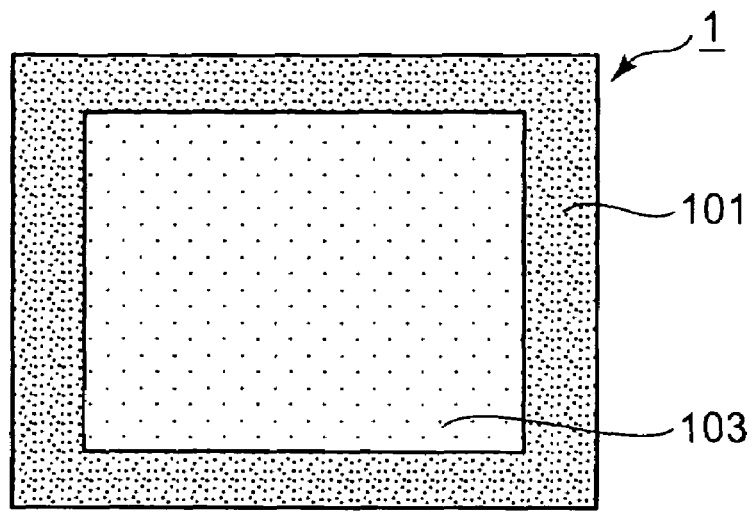
FIG. 1 is a plane view showing an embodiment of an electromagnetic wave shielding sheet according to the present invention.
Figure 2:
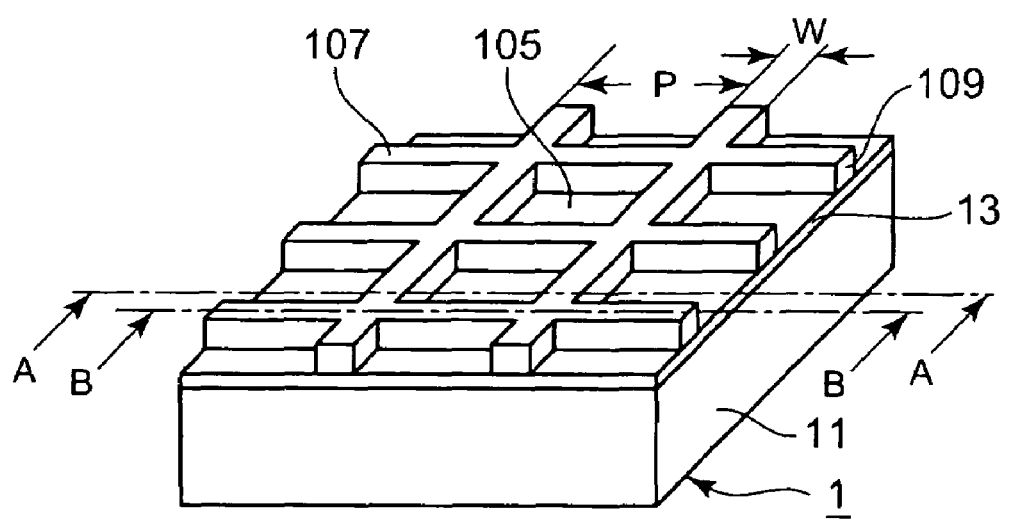
FIG. 2 is a perspective view of the mesh part shown in FIG. 1.
Figure 3:
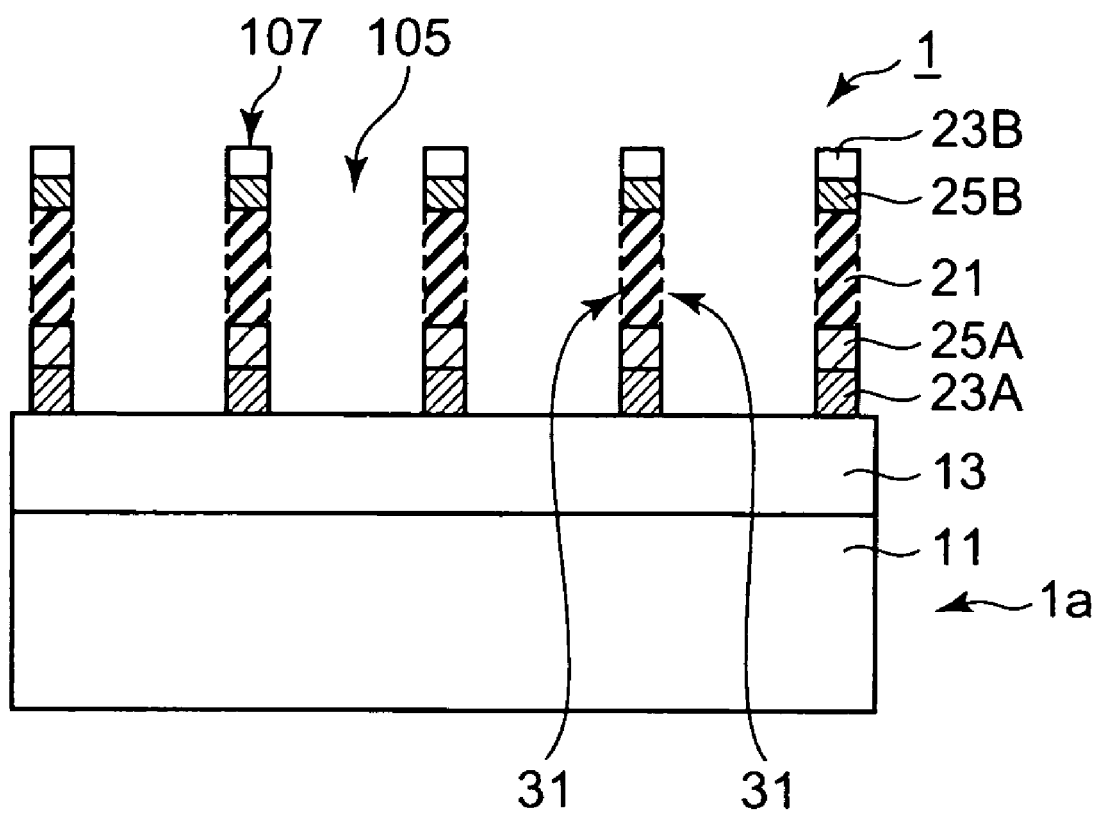
FIG. 3 is a sectional view of the mesh part of an electromagnetic wave shielding sheet.

An embodiment of the present invention is shown in FIGS. 1 to 3. This embodiment can cope with a design that makes it possible to mount an electromagnetic wave shielding sheet on a display with whichever side of the sheet, that is, either the transparent substrate 11 side or the metal layer 21 side, facing to the observer side of the display. In this embodiment, an electromagnetic wave shielding sheet 1 comprises a transparent substrate 11, and line parts 107 that define openings 105, formed on one surface of the transparent substrate 11 through an adhesive layer 13, as shown in the figures.

The line parts 107 have a metal mesh layer 21; a blackening layer 25A and an anticorrosive layer 23A that are successively formed on the surface of the metal layer 21 on the side of the transparent substrate 11 and a second blackening layer 25B formed on the surface of the metal layer 21 on the side opposite to the transparent substrate 11.

Of the line parts 107, at least the bare side faces of the metal layer 21 are covered with matted layers 31 (also referred to as matted faces). The matted layers 31 may also be formed so that they cover all of the bare side faces of the metal layer 21, the anticorrosive layer 23A, the blackening layer 25A, and the second blackening layer 25B.

The above-described line parts 107 constitute a mesh part 103 of the electromagnetic wave shielding sheet 1, and a frame part 101 having a frame-shaped external appearance with substantially no openings 105 is provided around the mesh part 103.

FIG. 3 is a sectional view taken along line A-A in FIG. 2, and the line part 107 extends along line B-B in FIG. 2.

Formation of the blackening layer at least on the surface on the observer side of a display is sufficient to fulfill the purpose. The blackening layer 25A can therefore be omitted if the electromagnetic wave shielding sheet 1 is so designed that it is mounted on a display with the side of the metal mesh layer 21 facing to the observer side. In the case where the electromagnetic wave shielding sheet 1 is so designed that it is mounted on a display with the side of the transparent substrate 11 facing to the observer side, the second blackening layer 25B can be omitted. If rust on the blackening layer or on the metal layer, or falling of the blackening layer causes no trouble, it is possible to omit the anticorrosive layer to be formed on the blackening layer or the metal layer. When the metal layer is formed on the transparent substrate 11 by such a method as vacuum deposition, the adhesive layer 13 can be omitted.

INVENTION OF PROCESS

In the electromagnetic wave shielding sheet according to the present invention, a mesh part 103 having line parts 107 that define two-dimensionally arranged multiple openings 105 is provided at least on one surface of the transparent substrate 11; at least the surfaces of the line parts 107, on the side of the transparent substrate 11, have been subjected to blackening treatment, and, of the side faces of the line parts 107, at least the side faces of the metal layer have been subjected to matting treatment. A process for producing the electromagnetic wave shielding sheet comprises (1) the step of preparing a metal layer 21, (2) the step of forming a blackening layer 25A at least on one surface of the metal layer 21, (3) the step of laminating the blackening layer 25A to the transparent substrate 11 by an adhesive 13, (4) the step of photolithographically making, into a mesh pattern, the first blackening layer 25A and the metal layer 21 that have been laminated to the transparent substrate 11, and forming matted layers 31 on the side faces of the line parts 107 of the mesh pattern.

This production process will be described in detail with reference to the flow of the steps shown in FIG. 4.

(First Step)
The step of preparing a metal layer (FIG. 4(a)).

(Metal Layer)
A metal having electrical conductivity good enough to fully shield electromagnetic waves, such as gold, silver, copper, iron, nickel, or chromium, may be used for the metal layer 21. The metal layer 21 may be a layer of either one metal or an alloy, or may also be composed of multiple layers. Low-carbon steels such as low-carbon rimmed steels and low-carbon aluminum killed steels, Ni—Fe alloys, and invar alloys are herein preferred as iron materials. If cathodic electrodeposition is conducted as blackening treatment, it is preferable to use copper or copper alloy foil as the metal layer 21 because it is easy to electrodeposit a blackening layer on such a material.

Although both rolled copper foil and electrolytic copper foil can be used as the copper foil, electrolytic copper foil is preferred because of its uniformity in thickness and adhesion to the blackening layer and/or chromate treatment layer and because it can have a thickness as small as below 10 μm. The thickness of the metal layer 21 is approximately from 1 to 100 μm, and preferably from 5 to 20 μm. If the metal layer 21 has a thickness smaller than the above range, although it is easy to photolithographically process the metal layer 21 into a mesh, the metal layer has an increased electrical resistance value and thus shows impaired electromagnetic wave shielding effect. When the metal layer 21 has a thickness in excess of the above range, it is impossible to make the metal layer 21 into a mesh with the desired minute openings. Consequently, the mesh has a decreased substantial opening rate and a lower light transmission rate, resulting in a narrower viewing angle and lower image visibility.

The surface roughness of the surface and back surface (the faces on the upper and lower sides in FIG. 3 or 4) of the metal layer 21 is preferably from 0.5 to 10 μm as indicated by the Rz value. If the metal layer 21 has a surface roughness of less than 0.5 μm, it reflects extraneous light by mirror reflection even if blackened, and thus makes image visibility lower. If the surface roughness of the metal layer 21 is more than 10 μm, an adhesive or resist, upon application thereof, does not spread over the entire surface of the metal layer, or involves air to produce air bubbles. The surface roughness Rz is herein a mean value of 10 measurements obtained in accordance with JIS-B0601 (1994 version).

Figure 4:
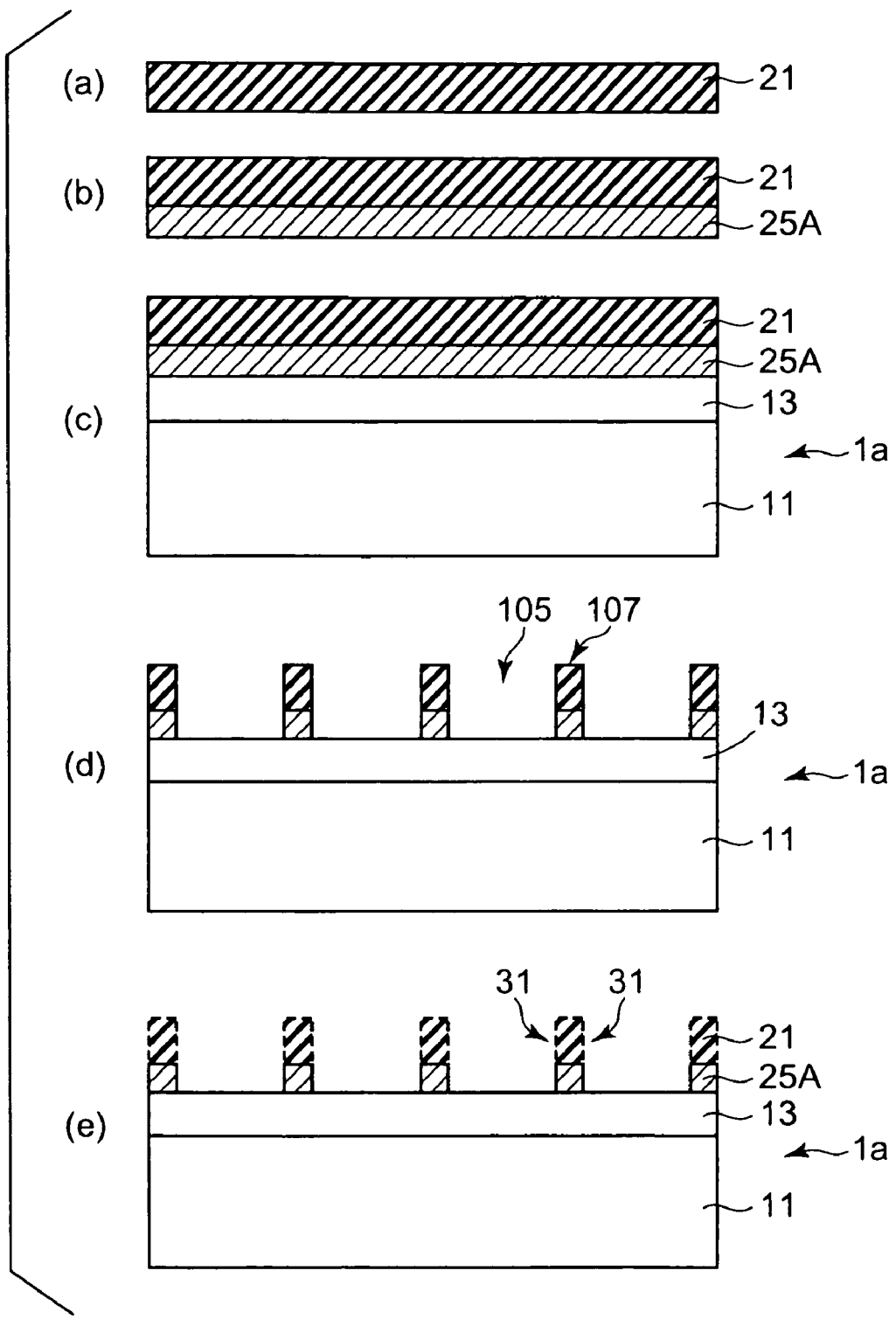
FIG. 4 is a sectional view illustrating the flow of steps in a process for producing an electromagnetic wave shielding sheet according to the present invention.

(Second Step)
In the step of forming a blackening layer 25A or a second blackening layer 25B at least on one surface of the metal layer 21 that faces to the observer side when the electromagnetic wave shielding sheet finally produced is mounted on the front of a display, (FIG. 4(b) shows the case where the side of the transparent substrate 11 (the lower side in FIG. 4) will face to the observer side, and the blackening layer 25A is essential in this case).

(Blackening Layer)
Regarding the formation of the blackening layer, that is, blackening treatment, in the case where the surface of the metal layer 21 on the side opposite to the transparent substrate 11, (the upper side in FIGS. 2 to 4) will face to the observer side, the second blackening layer 25B can be formed either on the metal layer 21 in the form of a single layer or on the metal layer 21 laminated to the transparent substrate 11. However, in the case where the side of the transparent substrate (the lower side in FIGS. 2 to 4) will face to the observer side, the blackening layer 25A is formed on the metal layer 21 that is still in the form of a single layer (before lamination). Lamination of a layer of a black material to the surface of the metal layer 21 suffices for the blackening treatment, and a metal, alloy, metallic oxide or metallic sulfide, or a black resin is used as the black material. A variety of methods can be used to form the blackening layer. Preferred methods for conducting the blackening treatment include plating, and plating makes it possible to form a blackening layer 25A on the metal layer 21 with good adhesion and to uniformly blacken the surface of the metal layer 21 with ease. At least one metal selected from copper, cobalt, nickel, chromium, zinc, molybdenum and tin, an alloy containing one or more of these metals, or a compound containing one or more of these metals can be used as plating material to be plated on the metal layer 21. When other metals or compounds are used, the metal layer cannot be fully blackened, or the blackening layer is poor in adhesion to the metal layer. For example, cadmium plating causes trouble.

The blackening layer is formed at least on one surface of the metal layer 21. In particular, if the blackening layer 25A is provided on the surface of the metal layer 21, on the side of the transparent substrate 11, this blackening layer 25A is formed on the back surface of the metal layer 21 at the stage before the step of lamination (the third step). The reason for this is that, since the back surface (the surface on the transparent substrate 11 side) of the metal layer 21 is processed into a mesh pattern after laminating the metal layer 21 to the transparent substrate 11 to intercept the former form the atmosphere, it is impossible to form the blackening layer after the step of processing the metal layer 21 into a mesh pattern (the fourth step). For this reason, it is necessary to complete the formation of the blackening layer 25A on the back surface of the metal layer at the stage before the step of lamination. On the other hand, the formation of the second blackening layer 25B on the surface, on the side opposite to the transparent substrate 11, of the metal layer 21 may be conducted either before or after the step of lamination.

When the blackening layers 25A, 25B are formed before the step of lamination, since they can be formed simultaneously by dipping, no additional step is needed and the yield is increased; the cost can thus be saved. On the other hand, to form the second blackening layer 25B after the step of lamination is more preferred from the viewpoint of image visibility because it is possible, in this case, to blacken not only the surface of the metal layer 21 but also the matted layers 31 formed on the side faces of the line parts 107.

A plating process that is preferably employed when copper foil is used as the metal layer 21 is cathodic electrodeposition plating in which copper foil is subjected to cathodic electrolysis in an electrolyte such as sulfuric acid, copper sulfate, or cobalt sulfate, thereby depositing cationic particles on the copper foil. The cationic particles deposited make the copper foil black in color. Although the cationic particles may be either copper particles or particles of an alloy of copper and another metal, copper-cobalt alloy particles are herein preferred. The mean particle diameter of the copper-cobalt alloy particles is preferably from 0.1 to 1 µm. Cathodic electrodeposition is convenient to deposit uniformly sized particles with a mean particle diameter of 0.1 to 1 µm. Further, if treated at high current density, the surface of copper foil becomes cathodic, generates reducing hydrogen, and is thus activated, so that significantly improved adhesion can be obtained between the copper foil and the particles.

In the case where the mean particle diameter of the copper-cobalt alloy particles is outside the above-described range, for example, when the mean particle diameter of the copper-cobalt alloy particles is greater than the above range, the blackness of the particles is insufficient, and, moreover, the falling of the particles (also referred to as falling of the powdery coating) easily occurs. In addition, the external appearance of the agglomerated particles becomes poor in denseness, and the non-uniformity of the external appearance and that of light absorption become noticeable. Also copper-cobalt alloy particles with a mean particle diameter of less than the above-described range are insufficient in blackness and cannot fully prevent reflection of extraneous light to make image visibility lower.

Black chromium, black nickel, and nickel alloys are preferred as blackening materials that are excellent in both electrical conductivity and blackness and scarcely fall off.

Examples of nickel alloys include nickel-zinc alloys, nickel-tin alloys, and nickel-tin-copper alloys. In particular, nickel alloys are excellent in electrical conductivity and blackness and has not only a blackening effect but also the function of protecting the metal layer 21 from corrosion. Further, since the particles that form the blackening layer are usually in the shape of needles, they are readily deformed by external force and undergo changes in external appearance, but nickel alloy particles are not easily deformed. Especially in the case where the second blackening layer 25B is provided, since the bare surface of this layer is processed in the later step, it is more preferable to use a nickel alloy whose particles are hard to deform and fall off. A conventional electroplating process suffices to deposit a nickel alloy. In order to increase adhesion to the underlying layer, nickel plating may be conducted before depositing a nickel alloy.

In this Specification, the reflection Y value of the blackening layer is approximately 15 or less, preferably 5 or less, more preferably 2.0 or less. Methods for measuring the reflection Y value include a method using a spectrophotometer UV-3100PC (manufactured by Shimadzu Corp., Japan), measuring at an angle of incidence of 5° (wavelength: 380-780 nm).

(Anticorrosive Layer)

Anticorrosive layers 23A, 23B may optionally be formed on the surfaces of the blackening layer 25A and/or the second blackening layer 25B surface. The anticorrosive layers 23A, 23B have the function of protecting the metal layer 21 and the surfaces of the blackening layers 25A, 25B from corrosion, the function of preventing falling or deformation of those particles that form the blackening layers 25A, 25B, and the function of increasing the blackness of the blackening layer 25A. The reason why the anticorrosive layers 23A, 23B are thus formed is as follows. Namely, since the anticorrosive layer 23A is formed in order to prevent falling and deterioration of the blackening layer 25A that tend to occur in a period before laminating the blackening layer 25A formed on the back surface of the metal layer to the transparent substrate, it is proper to form the anticorrosive layer 23A before the step of lamination.

Although conventional anticorrosive layers may be used as the anticorrosive layers 23A, 23B, layers of metals such as chromium, zinc, nickel and/or tin, layers of alloys of these metals, layers of oxides of nickel, zinc and/or copper, or layers of chromium compounds are suitably used, and layers containing chromium and/or zinc and layers made from chromium compounds are preferred. Further, it is preferable that the anticorrosive layers 23A, 23B contain silica compounds so as to show increased acid resistance at the time when etching or rinsing with an acid is effected. Examples of the silica compounds include silane-coupling agents.

The anticorrosive layers 23A, 23B are excellent in resistance to photosensitive resists, developing solutions, etchants, and so on to which they are exposed to one after another. Further, the anticorrosive layer 23A is also excellent in adhesion to the blackening layer 25A (especially, a layer of copper-cobalt alloy particles) and also in adhesion to the adhesive layer 13 (especially, a two-part curing urethane resin adhesive).

A known process of plating is employed to deposit a metal such as chromium, zinc, nickel and/or tin, an alloy of these metals, or an oxide of nickel, zinc and/or copper. To deposit a chromium compound, a conventional plating process, chromate (a salt of chromic acid) treatment, or the like is employed. The thickness of the anticorrosive layers 23A, 23B is approximately from 0.001 to 10 µm, preferably from 0.01 to 1 µm.

When chromate treatment is conducted to form the anticorrosive layers 23A, 23B, a coating or flow coating method may be employed to form an anticorrosive layer only on one surface of the metal layer 21, or anticorrosive layers on both surfaces of the metal layer 21. The anticorrosive layers 23A, 23B may also be simultaneously formed on both surfaces of the metal layer 21 by dipping. In the case where both surfaces of the metal layer 21 have been treated simultaneously, the anticorrosive layer present on the surface of the blackening layer 25A is referred to as an anticorrosive layer 23A, and the anticorrosive layer present on the surface of the metal layer 21 or on the surface of the second blackening layer 25B, a second anticorrosive layer 23B. To simultaneously treat both surfaces of the metal layer is preferred because no additional step is needed, the yield is increased, and, as a result, the cost can be saved.

(Chromate Treatment)

Chromate treatment is that a chromate treatment liquid is applied to an object to be treated. For the application of a chromate treatment liquid, a roll, curtain, squeeze, electrostatic spray, or dip coating method, for example, can be employed, and the chromate treatment liquid applied is not washed away with water but is dried as it is. An aqueous solution containing chromic acid is usually used as the chromate treatment liquid. Specific examples of the chromate treatment liquid include Alsurf 1000 (trademark of a chromate treatment agent, manufactured by Nippon Paint Co., Ltd., Japan), and PM-284 (trademark of a chromate treatment agent, manufactured by Nippon Parkerizing Co., Ltd., Japan).

It is preferable to conduct zinc plating prior to the chromate treatment, and the resulting structure, that is, the blackening layer/the anticorrosive layer (two layers of zinc layer/chromate treatment layer), can increase ply adhesion, enhance the resistance to corrosion, and improve the blackening effect.

(Third Step)

The step of laminating the metal layer 21 and the transparent substrate 11 (especially when the blackening layer 25A is provided on the transparent-substrate-side-surface of the metal layer 21, the step of laminating the blackening layer 25A and the transparent substrate) with an adhesive (FIG. 4(c)).

(Transparent Substrate)

Any of various materials can be used for the transparent substrate 11 as long as it has transparency, insulating properties, heat resistance, mechanical strength, and so on that can stand for service and production conditions. Examples of materials useful herein include glass and transparent resins. Glass includes silica glass, borosilicate glass and soda-lime glass, and it is preferable to use non-alkali glass containing no alkali components, having a low rate of thermal expansion, being excellent in dimensional stability, showing excellent working properties in high-temperature heat treatment. A non-alkali glass substrate may be made to serve also as a substrate for an electrode.

Examples of transparent resins herein useful include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polymethyl methacrylate; styrene resins such as polystyrene and styrene-acrylonitrile copolymers; cellulose resins such as triacetyl cellulose; imide resins; and polycarbonate. A sheet, film, plate or the like of any of these resins can be used as the transparent substrate.

The transparent-resin-made transparent substrate may be made of any one of the above-enumerated resins or a mixture (including an alloy) of two or more of the above resins, or may be a laminate of a plurality of layers. Although the transparent substrate may be either an oriented film or a non-oriented film, a mono- or bi-axially oriented film is preferably used in order to obtain increased strength. The thickness of the transparent substrate is usually about 12 to 1000 µm, preferably 50 to 700 µm, and most preferably 100 to 500 µm, when the transparent substrate is made from a transparent resin. In the case where the transparent substrate is made of glass, the preferred thickness of the transparent substrate is usually about 1000 to 5000 µm. In either case, a transparent substrate with a thickness of less than the above range cannot have sufficiently high mechanical strength, so that it curls, becomes wavy, or is broken; while a transparent substrate with a thickness of more than the above range has excessively high strength, which is wasteful from the viewpoint of cost.

In general, a film of a polyester resin such as polyethylene terephthalate or polyethylene naphthalate, a cellulose resin film, or a glass plate is conveniently used as the transparent substrate because it is excellent in both transparency and heat resistance and is inexpensive, and a polyethylene terephthalate film is most preferred because it is hard to break, is light in weight, and is easy to shape. Although the higher the transparency of the transparent substrate 11, the better, it is preferable that the transparent substrate 11 has a transmittance of 80% or more for visible light.

The surface of the transparent substrate film to be coated with an adhesive may be subjected to adhesion-improving treatment such as corona discharge treatment, plasma treatment, ozone treatment, flame treatment, primer (also referred to as anchoring, adhesion-promoting or adhesion-improving agent) coating treatment, preheating treatment, dust-removing treatment, vacuum deposition, or alkali treatment. Additives such as ultraviolet light absorbers, fillers, plasticizers, and antistatic agents may also be incorporated in the resin film, as needed.

(Lamination Process)

The transparent substrate 11 and the metal layer on which the above-described blackening layer has been formed are laminated to each other. This step will be described by referring to the case where the blackening layer 25A has been formed on the metal layer, as shown in FIG. 4. As shown in FIG. 4(c), the blackening layer 25A/the metal layer 21 is laminated to the transparent substrate 11 by an adhesive 13 with the surface of the blackening layer 25A facing to the transparent substrate 11, thereby obtaining a laminate 1a. The process of this lamination is as follows: an adhesive resin, or a mixture containing the adhesive resin, is made into a fluid such as a hot melt, a non-crosslinked polymer, a latex, an aqueous dispersion, or an organic solvent solution, which is then printed on or applied to the transparent substrate 11 and/or the blackening layer 25A by a conventional printing or coating method such as screen printing, gravure printing, comma coating, or roll coating, and is dried, if necessary; the transparent substrate 11 is superposed on the blackening layer 25A/the metal layer 21, and pressure is applied; and the adhesive 13 is then hardened. The thickness of the adhesive layer 13 is approximately from 0.1 to 100 µm (dry basis), preferably from 1 to 30 µm.

Specifically, the metal layer 21 and the transparent substrate 11 that are in continuous belt-shaped (rolled-up) forms are usually used in the lamination process; the adhesive is applied to one of a metallic foil and a substrate film in the state of being unrolled from a wind-up roll and stretched, and is then dried; the other member is superposed on this adhesive layer, and pressure is applied. It is preferable to use a process that is called dry lamination by those skilled in the art.

(Dry Lamination Process)

Dry lamination is a process for laminating two materials in the following manner: by a coating method such as roll, reverse roll or gravure coating, an adhesive dispersed or dissolved in a solvent is applied to one material so that the layer applied has a thickness of approximately 0.1 to 20 µm (dry basis), preferably 1 to 10 µm, and the solvent is evaporated to form an adhesive layer; immediately after the formation of the adhesive layer, the other laminating material is superposed on the adhesive layer; and the laminate obtained is aged at 30 to 120° C. for several hours to several days, or is irradiated with ionizing radiation such as ultraviolet light or electron beams, to harden the adhesive. The adhesive that can be used in the dry lamination process includes adhesives made from thermosetting (or two-part curing) resins and adhesives made from ionizing radiation curing resins. Specific examples of thermosetting resins useful herein include two-part curing urethane resins that are obtained by the reaction of polyfunctional isocyanates such as tolylene diisocyanate or hexamethylene diisocyanate with hydroxyl-group-containing compounds such as polyether polyols or polyacrylate polyols; acrylic resins; rubber resins; and epoxy resins. Of these, two-part curing urethane adhesives are preferred. Examples of the ionizing radiation curing resins useful herein include polymerizable-functional-group-containing acrylic monomers, acrylic prepolymers, and epoxy prepolymers.

(Fourth Step)

The step of photolithographically making, into a mesh pattern, the laminate 1a of the transparent substrate 11, and at least the blackening layer 25A or the second blackening layer 25B and the metal layer 21 that are laminated to the transparent substrate 11, and matting the side faces of the line parts 107 of the mesh.

(Fourth Step—1)

First, the laminate of the transparent substrate and the metal layer having the blackening layer are photolithographically made into a mesh. For example, in the case shown in FIG. 4, the blackening layer 25A/the metal layer 21 in the laminate 1a of the transparent substrate 11/the adhesive layer 13/the blackening layer 25A/the metal layer 21 is photolithographically made into a mesh (FIG. 4(d)). In the case of a laminate of the greatest number of layers, the layers that are made into a mesh include at least the anticorrosive layer 23A/the blackening layer 25A/the metal layer 21/the second blackening layer 25B/the second anticorrosive layer 23B. Of these layers, the metal layer 21 and either the blackening layer 25A or the second blackening layer 25B are essential, and the other layers can be omitted. The laminate of these layers that is made into a mesh is referred to as an electromagnetic wave shielding layer.

(Photolithographic Process)

A mesh-patterned resist layer is formed on the surface of the metal layer 21 in the above-described laminate; those portions of the metal layer 21 that are not covered with the resist layer are removed by etching; and the resist layer is then stripped, thereby obtaining an electromagnetic wave shielding layer in a mesh pattern. As shown in FIG. 1, a plane view, the electromagnetic wave shielding layer is composed of a mesh part 103 and a frame part 101 that is optionally provided around the mesh part 103. As shown in FIG. 2, a perspective view, and in FIG. 3, a sectional view, the mesh part 103 has line parts 107, the remaining metal layer, by which openings 105 are defined, while the frame part 101 has no openings and is wholly the non-etched, remaining metal layer 21. The frame part 101 is optional and may be provided in the whole area surrounding the mesh part 103 or at least in a part of this area.

Also the above-described process is for processing the belt-shaped laminate 1a in the form of a continuously wound-up roll. While unwinding and transferring the laminate 1a either continuously or intermittently, masking, etching, and resist stripping are conducted with the laminate stretched and non-loosened. First, masking is conducted in the following manner: a photosensitive resist, for example, is applied to the metal layer 21 and is dried; this resist is subjected to contact exposure, using an original plate with a predetermined pattern (composed of the line parts of the mesh part and the frame part); thereafter, development with water, film-hardening treatment, and baking are conducted.

The application of a resist is conducted in the following manner: while continuously or intermittently unwinding and transferring the belt-shaped, wound-up laminate, a resist made from casein, PVA, or gelatin is applied to the metal layer of the laminate by such a method as dipping, curtain coating, or flow coating. Alternatively, a dry film resist may be used as the resist, and the use of a dry film resist improves working properties. When casein is used as the resist, although baking is usually conducted by heating, it is preferable to effect baking at a temperature as low as possible in order to prevent the laminate 1a from curling.

(Etching)

Etching is conducted after masking. Since etching is conducted continuously, it is preferable to use, as an etchant, an aqueous ferric or cupric chloride solution that can be readily circulated. Further, since the process of etching herein is basically the same as the process of producing a shadow mask for a cathode ray tube of color TV, in which belt-shaped continuous steel stock, especially a thin plate with a thickness of 20 to 80 µm, is etched, it is possible to use the existing facilities for producing the shadow mask and continuously effect a series of the steps of from masking to etching. There is therefore attained significantly high production efficiency.

(Mesh)

The mesh part 103 is an area surrounded by the frame part 101. The mesh part 103 has line parts 107 that define a plurality of openings 105. The openings 105 are not limited in shape (pattern of meshes), and the shape of the openings 105 may be a triangle such an equilateral triangle, a square such as a regular square, rectangular, rhombus or trapezoid, a polygon such as a hexagon, a circle, an oval, or the like. The mesh part 103 is a combination of a plurality of these openings 105. From the viewpoint of the opening rate and the invisibility of the mesh, the line width W is preferably 50 µm or less, more preferably 20 µm or less, and from the viewpoint of light transmittance, the line distance (line pitch) P is preferably 150 µm or more, more preferably 200 µm or more. The opening rate is made not less than 50% of the total area of the mesh part. In order to avoid the occurrence of moiré fringes or the like, the angle between the lines may be properly selected with consideration for the pixel and emission properties of a display.

(Fourth Step—2)

Figure 5:
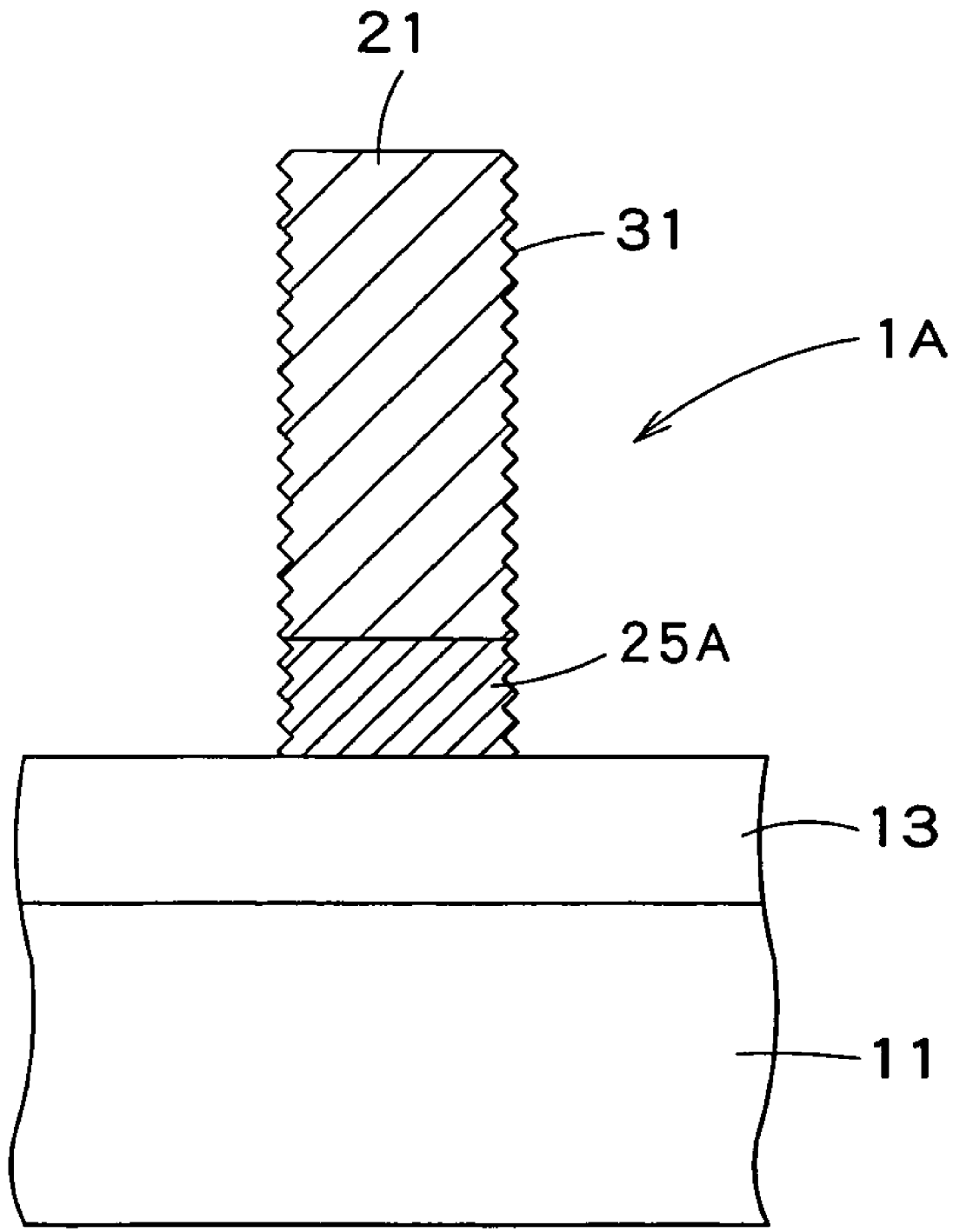
FIG. 5 is an enlarged view of matted layers shown in FIG. 4, formed on the metal layer and the blackening layer.

After etching, at least the side faces of the metal layer 21 in the line parts 107 are roughened to form matted layers 31 before stripping the resist. The matted layers 31 can be formed by conventional chemical conversion treatment using chemicals, and a treatment liquid BO-7770V (a trademark of a treatment liquid, manufactured by Meck Co., Ltd., Japan), for example, may be used for this treatment (FIG. 4(e)). FIG. 5 is an enlarged view of the matted layers 31 shown in FIG. 4(e). The etched laminate is dipped into a treatment liquid at a temperature of approximately 20 to 60° C. for approximately 15 to 45 seconds. After the matted layers 31 have been formed, washing with water, resist stripping with an alkaline solution, cleaning, and drying are successively conducted.

When the matted layers 31 are thus formed, the side faces of the line parts 107 of the metal mesh layer 21 are covered with the matted layers 31, and fine irregularities are made on these side faces. Unlike the blackening treatment by which a layer of a black material is deposited on a metal, the matting treatment is for roughening a bare metal surface.

Incidentally, the observer-side surfaces of the line parts 107 have a relatively large (effective) area of the surface that reflects extraneous light (the topmost faces of the line parts shown in FIG. 3, for example). It is, therefore, necessary that a blackening layer that absorbs, and does not reflect, extraneous light itself be present on the observer-side surfaces of the line parts. On the other hand, the side faces of the line parts have a small effective area of the surface that reflects extraneous light. Namely, of the side faces of the line parts, only projective faces reflect extraneous light toward observers, and, moreover, a large part of the reflected light is lost because the light reflected from the side faces travels to the opposite side faces by which the light is blocked or from which the light travels toward the transparent substrate side. For this reason, it is not necessary to blacken the side faces of the line parts, and by merely roughening them to such a degree that they can diffuse reflected light, it is possible to sufficiently attenuate extraneous light to be reflected to enter the observes' eyes. A surface roughened to such a degree that it can diffuse-reflects light suffices for the matted layer 31. The color (spectral color) of the matted layer 31 itself may be the same as that of the metal layer itself, provided that the glossiness of the former is lower than that of the latter. However, the color of the matted layer itself may be made to have lower brightness and chroma (made blacker) than those of the color of the metal layer itself, and this is more preferred when the effect of reducing reflection of extraneous light is taken into consideration. The surface roughness of the matted layer 31 is from 0.1 to 10 μm, more preferably from 0.5 to 3 μm, as indicated by the Rz value defined by JIS B0601 (1994 version). The surface of the metal layer 21 that has been roughened to have fine irregularities as desired suffices for the matted layer 31. To obtain such a rough surface, another layer having a rough surface may be laminated to the metal layer 21, or the surface of the metal layer 21 itself is simply roughened without laminating any layer. Therefore, the term "matted layer 31" may also be referred to as "(the formation of) matted face 31".

As a result, the blackening layer 25A or 25B is formed at least on the surface (either the face or the back) of the metal mesh layer 21 that will face to the observer side of a display, and the matted layers 31 are formed on the side faces of the line parts 107. With respect to both extraneous light such as sunlight and light from fluorescent tubes, and display light from a PDP, the reflected light within a specific solid angle that enters the observers' eyes has intensity below the threshold of visual recognition owing to the matted layers 31 formed on the side faces of the line parts 107. Moreover, the above-described extraneous light and display light are not reflected owing to the blackening layer 25A or 25B formed on the observer-side-surfaces of the line parts 107. For this reason, a high-contrast image in an excellent state can be viewed on a display.

A combination of the electromagnetic wave shielding sheet of the present invention and other optical members can be used as favorable front panels for PDPs. For example, a combination of the electromagnetic wave shielding sheet and an optical member having the function of absorbing near infrared rays can absorb near infrared rays emitted from a PDP, so that it can prevent malfunction of remote-control apparatus, optical communication apparatus, and the like that are being used near the PDP. Further, a combination of the electromagnetic wave shielding sheet and an optical member having the function of preventing reflection and/or glaring of light does not reflect both display light from a PDP and extraneous light externally incident on the PDP, so that it can improve image visibility.

In the case where the frame part 101 is provided, since this part is also blackened simultaneously with the mesh part 103 and thus becomes blacker, it makes a display seem high class.

Moreover, in the electromagnetic wave shielding layer of the electromagnetic wave shielding sheet of the present invention, since at least one surface of the metal layer 21 is made black in color, the electromagnetic wave shielding sheet can be mounted on a PDP with the blackening layer side facing to the observer side. In the case where blackening layers are formed on both surfaces of the metal layer 21, as shown in FIG. 3, the electromagnetic wave shielding sheet can be mounted on a PDP with either surface facing to the PDP.

Furthermore, when a flexible material is used for the transparent substrate 11, and when a belt-shaped, continuously rolled-up (wound-up) laminate is, in every step, processed while continuously or intermittently unwinding and transferring the laminate, the matting treatment can be conducted by dipping the laminate into a treatment liquid in the course of the photolithographic process. In general, equipment includes a plurality of baths and some of them are empty in many cases, so that it is possible to conduct the matting treatment by using such an empty bath, simply filling it with a treatment liquid.

MODIFIED EMBODIMENTS

The present invention encompasses the following modifications.

(1) Although the lamination of the transparent substrate 11 and the blackening layer 25A/the metal layer 21 has been described with reference to a lamination process using an adhesive, the step of lamination can be effected without using any adhesive. For example, after making the surface of the transparent substrate 11 electrically conductive, the blackening layer 25A and the metal layer 21 may be formed on this surface by a known electroless plating or electroplating process.

(2) After obtaining the electromagnetic wave shielding sheet 1 shown in FIG. 3, the surface of the mesh part 103 that is rough due to the line parts 107 and the openings 105 may be smoothened by filling the openings 105 with a transparent resin. If the surface of the mesh part 103 is smoothened in this manner, air bubbles never remain in the openings 105 when the mesh part 103 of the electromagnetic wave shielding sheet 1 and another member (a transparent substrate, a near infrared ray absorbing filter, an antireflection filter, or the like) are laminated with an adhesive layer in the later step. It is thus possible to avoid lowering of the sharpness of a displayed image that occurs if air bubbles remain in the openings and scatter light.

EXAMPLES

The present invention will now be explained more specifically by way of Examples and Comparative Example. However, the present invention is not limited to the following Examples.

Example 1

Electrolytic copper foil with a thickness of 10 μm was used as the metal layer 21. Copper-cobalt alloy particles (mean particle diameter: 0.3 μm) were cathodically electrodeposited on one surface of the metal layer 21, thereby conducting blackening treatment to form a blackening layer 25A. After plating the metal layer 21 with zinc, conventional chromate treatment was conducted by a dipping method to form anticorrosive layers containing zinc and chromium on both surfaces of the metal layer 21. The anticorrosive layer present on the surface of the blackening layer 25A is herein referred to as an anticorrosive layer 23A, and the anticorrosive layer present on the surface of the metal layer 21 is referred to as a second anticorrosive layer 23B.

The surface of the metal layer 21 on the anticorrosive layer 23A and a transparent substrate 11 made of a PET film A4300 (trademark of a polyethylene terephthalate film, manufactured by Toyobo Co., Ltd., Japan) with a thickness of 100 µm were laminated with an adhesive layer 13 of a two-part curing urethane adhesive, and this was aged at 50° C. for 3 days, thereby obtaining a laminate 1a. For the adhesive were used a main agent Takelack A-310 (trademark, manufactured by Takeda Chemical Industries, Ltd., Japan) consisting of polyester urethane polyol, and a curing agent A-10 (trademark, manufactured by Takeda Chemical Industries, Ltd., Japan) consisting of xylene diisocyanate. The adhesive was applied in such an amount that the dry adhesive layer had a thickness of 7 µm.

The anticorrosive layer 23A/the blackening layer 25A/the metal layer 21/the second anticorrosive layer 23B in the laminate 1a was photolithographically made into a mesh pattern.

Using the existing production line for shadow masks for color TV, the laminate in the form of a belt-shaped (rolled-up) continuous web was subjected to a series of the steps of from masking to etching. First, a casein photosensitive resist was applied to the entire surface of the metal layer 21 in the laminate 1a by dipping. This laminate was intermittently transferred to the next station, where contact exposure to ultraviolet light from a mercury vapor lamp was conducted by the use of a negative pattern plate for forming a mesh part having line parts with a line width W of 22 µm, a line distance (pitch) P of 300 µm, and a mesh angle (the angle between the line parts 107 of the mesh and the sides of the electromagnetic wave shielding sheet) of 49 degrees, the line parts defining regular-square openings, and a frame part with a width of 15 mm, surrounding the mesh part. The exposed laminate was then transferred from one station to another for development with water, for film-hardening treatment, and for baking by heating. The baked laminate was further transferred to the next station, where etching was conducted by spraying, as an etchant, an aqueous ferric chloride solution over the laminate to make openings 105 in the laminate.

While transferring from one station to another, the laminate was dipped into a treatment liquid BO-7770V (trademark of a treatment liquid, manufactured by Meck, Co., Ltd., Japan) at a temperature of 25° C. for 25 seconds to finely roughen the side faces of the line parts 107, thereby matting the side faces to form matted layers 31. After washing the laminate with water, a mesh was obtained by stripping the resist, and cleaning and drying, at 80° C., the laminate. Thus, there was obtained an electromagnetic wave shielding sheet 1 of Example 1.

Example 2

An electromagnetic wave shielding sheet 1 was obtained in the same manner as in Example 1, provided that blackening treatment is conducted by cathodically electrodepositing copper-cobalt alloy particles (mean particle diameter: 0.3 µm) on both surfaces of electrolytic copper foil with a thickness of 10 µm, serving as the metal layer 21.

Comparative Example 1

An electromagnetic wave shielding sheet 1 of Comparative Example 1 was obtained in the same manner as in Example 1, provided that the matting treatment was not conducted.

(Evaluation)

Evaluation was carried out in terms of image visibility and electromagnetic wave shielding ability.

Each electromagnetic wave shielding sheet was mounted on the front of a PDP "WOOO" (trademark, manufactured by Hitachi Ltd., Japan) with the side of the metal layer 21 of the electromagnetic wave shielding side of the sheet facing to the PDP. A test pattern, a white solid image, and a black solid image were displayed on the PDP one after another and were visually observed from a point 50 cm apart from the screen at viewing angles of 0 to 80 degrees to evaluate the visibility of the images. In this evaluation, luminance, contrast, reflection and glaring of extraneous light at the time of black indication, and non-uniformity in blackening treatment at the time of white indication were observed. The electromagnetic wave shielding sheets of Examples 1 and 2 were found excellent for making the images highly visible. When the electromagnetic wave shielding sheet of Comparative Example 1 was mounted, the screen was whitened due to extraneous light and image contrast was decreased, and especially when obliquely observed, the screen appeared reddish; overall, the quality of the images were found poor.

Further, electromagnetic wave shielding ability was evaluated by the KEC method (a method of measuring electromagnetic waves developed by Kansai Electronic Industry Development Center, Japan). All of the electromagnetic wave shielding sheets of Examples 1 and 2 and Comparative Example 1 attenuated, at rates of 30 to 60 dB, electromagnetic waves having frequencies of 30 MHz to 1000 MHz and were thus found to have satisfactorily high electromagnetic wave shielding ability.

The invention claimed is:

1. An electromagnetic wave shielding sheet comprising:
   a transparent substrate, and
   line parts that define openings, formed on one surface of the transparent substrate,
   the line parts having a metal mesh layer and a blackening layer formed at least on one surface of the metal layer,
   matted layers being formed so that, of the side faces of the line parts, at least the side faces of the metal layer are covered with the matted layers.

2. The electromagnetic wave shielding sheet according to claim 1, wherein
   an anticorrosive layer is formed on the surface of the metal layer or of the blackening layer.

3. The electromagnetic wave shielding sheet according to claim 2, wherein
   the matted layers are formed to cover the side faces of the metal layer, the blackening layer, and the anticorrosive layer that constitute the line parts.

4. The electromagnetic wave shielding sheet according to claim 1, wherein
   the blackening layer is made of a copper-cobalt alloy or a nickel alloy.

5. The electromagnetic wave shielding sheet according to claim 2, wherein
   the anticorrosive layer contains chromium, zinc, or both chromium and zinc.

6. The electromagnetic wave shielding sheet according to claim 1, wherein
   an adhesive layer is interposed between the transparent substrate and the line parts.

7. A process for producing an electromagnetic wave shielding sheet comprising a transparent substrate, and line parts that define openings, formed on one surface of the transparent substrate, the line parts having a metal mesh layer and a blackening layer formed at least on one surface of the metal layer, matted layers being formed so that, of the side faces of the line parts, at least the side faces of the metal layer are covered with the matted layers, the process comprising the steps of:

preparing a metal layer, forming a blackening layer at least on one surface of the metal layer, laminating a transparent substrate to the metal layer and the blackening layer by an adhesive with the blackening layer facing to the transparent substrate, thereby obtaining a laminate, photolithographically patterning the blackening layer and the metal layer in the laminate, into a mesh, to form line parts defining openings that have the metal layer and the blackening layer and, forming, by matting treatment, matted layers at least on the side faces of the metal layer in the line parts.

* * * * *